US007696909B2

(12) United States Patent
Oberhuber

(10) Patent No.: US 7,696,909 B2

(45) Date of Patent: Apr. 13, 2010

(54) CIRCUIT FOR GENERATING A TEMPERATURE DEPENDENT CURRENT WITH HIGH ACCURACY

(75) Inventor: Ralph Oberhuber, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 663 days.

(21) Appl. No.: 11/509,107

(22) Filed: Aug. 23, 2006

(65) Prior Publication Data

US 2008/0061864 A1 Mar. 13, 2008

(51) Int. Cl.
*H03M 1/06* (2006.01)

(52) U.S. Cl. ....................... 341/119; 327/307; 327/512; 327/513

(58) Field of Classification Search ................. 341/119, 341/144; 327/307, 512, 513; 323/313, 314, 323/315, 907

See application file for complete search history.

(56) References Cited

U.S. PATENT DOCUMENTS 6,614,305 B1 9/2003 Ivanov et al.
6,628,169 B2 9/2003 Ivanov et al.
6,750,641 B1 6/2004 Ivanov et al.
2005/0073290 A1* 4/2005 Marinca et al. ............. 323/907
2005/0128018 A1* 6/2005 Meltzer ...................... 331/176
2005/0248405 A1* 11/2005 Tsuchi ....................... 330/257

* cited by examiner

*Primary Examiner*—Jean B Jeanglaude
(74) *Attorney, Agent, or Firm*—John J. Patti; Wade J. Brady, III; Frederick J. Telecky, Jr.

(57) ABSTRACT

An apparatus for adjusting a first signal with respect to a second signal includes: (a) A first converter receiving the first signal and employing n first converting elements for digitally converting the first signal to at least one first signal element. (b) A second converter coupled with an output, receiving the second signal and employing n second converting elements for digitally converting the second signal to a second representative signal presented at the output. (c) An adjusting element coupled with each of selected of the first converting elements. Each adjusting element is coupled with the output and cooperates with the connected selected element to present a corrected signal element to the output. The output presents an aggregate output signal including contributions from the second representative signal and each corrected signal element. Adjusting is effected by altering at least one corrected first signal element presented to the output.

16 Claims, 7 Drawing Sheets

CIRCUIT FOR GENERATING A TEMPERATURE DEPENDENT CURRENT WITH HIGH ACCURACY

CROSS-REFERENCE TO RELATED APPLICATIONS

The present application is related to U.S. patent application Ser. No. 11/502,822 entitled "APPARATUS AND METHOD FOR COMPENSATING CHANGE IN A TEMPERATURE ASSOCIATED WITH A HOST DEVICE," filed Aug. 10, 2006, which is assigned to the current assignee hereof.

TECHNICAL FIELD

The invention relates generally to current generation and, more particularly, to generating a temperature dependent current with high accuracy.

BACKGROUND

To reduce temperature drift in an analog circuit, a temperature dependent bias current I(T) may be used. The bias current I(T) may be generated from a PTAT or Proportional To Absolute Temperature current digital-to-analog converter or DAC coupled to a CTAT or Complementary To Absolute Temperature current DAC. The CTAT current is subtracted from the PTAT current, or vice versa, to generate the desired bias current I(T). The resulting I(T) is injected into a sensitive node of the circuit to be compensated.

Accurate control of absolute value of bias current I(T) at 0 is desirable because it defines the accuracy of the voltage in the sensitive node of the circuit into which the correcting current is injected. This absolute value of bias current I(T) is limited by the matching and resolution of the network of trimmable current sources providing bias current I(T). Providing such a network of trimmable current sources generally require high chip areas and significant power consumption.

SUMMARY

An apparatus for adjusting a first signal with respect to a second signal includes: (a) A first converter receiving the first signal and employing n first converting elements for digitally converting the first signal to at least one first signal element. (b) A second converter coupled with an output, receiving the second signal and employing n second converting elements for digitally converting the second signal to a second representative signal presented at the output. (c) An adjusting element coupled with each of selected of the first converting elements. Each adjusting element is coupled with the output and cooperates with the coupled selected element to present a corrected signal element to the output. The output presents an aggregate output signal including contributions from the second representative signal and each corrected signal element. Adjusting is effected by altering at least one corrected first signal element presented to the output.

A method for adjusting a first electrical signal with respect to a second electrical signal; the method includes the steps of: (a) in no particular order: (1) providing a first converting unit configured for receiving the first electrical signal; the first converting unit having a plurality of n selectively switchable first binary converting elements; and (2) providing a second converting unit configured for receiving the second electrical signal; the second converting unit having a plurality of n selectively switchable second binary converting elements; the second converting unit being coupled with an output locus; (b) providing a respective adjusting element coupled with each of a respective selected element of a plurality of selected elements of the plurality of the n switchable first binary converting elements; each respective adjusting element being coupled with the output locus; (c) in no particular order: (1) operating the plurality of n selectively switchable first binary converting elements to effect digital conversion of the first electrical signal to at least one first representative signal element representing the first electrical signal; (2) operating the plurality of n selectively switchable second binary converting elements for effecting digital conversion of the second electrical signal to a second representative signal representing the second electrical signal; the second converting unit presenting the second representative signal to the output locus; and (3) operating each respective adjusting element in cooperation with the respective coupled selected element to present a respective corrected first representative signal element to the output locus; the output locus presenting an aggregate output signal including contributions from the second representative signal and each respective corrected first representative signal element presented to the output locus; and (d) effecting the adjusting by altering at least one corrected first representative signal element presented to the output locus.

It is, therefore, an object of the present invention to provide an apparatus and method for adjusting a first electrical signal with respect to a second electrical signal that can present high resolution for a resulting signal, such as a bias current I(T) for injection as a compensating current into a host device.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
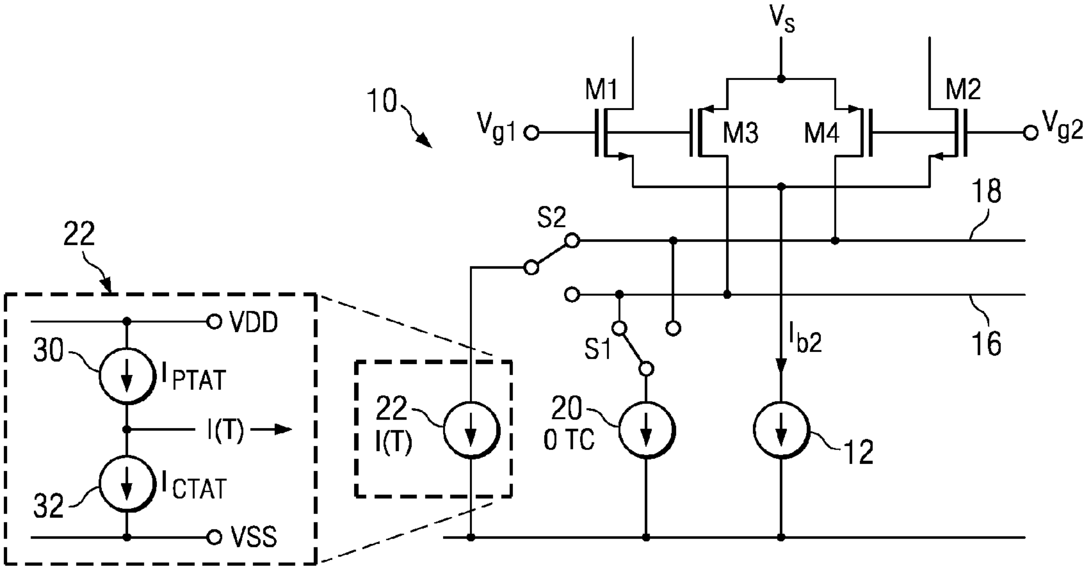
FIG. 1 (PRIOR ART)
FIGS. 1 and 2 are a diagram illustrating examples of conventional circuit.

Refer now to the drawings wherein depicted elements are, for the sake of clarity, not necessarily shown to scale and wherein like or similar elements are designated by the same reference numeral through the several views.

Figure 3:
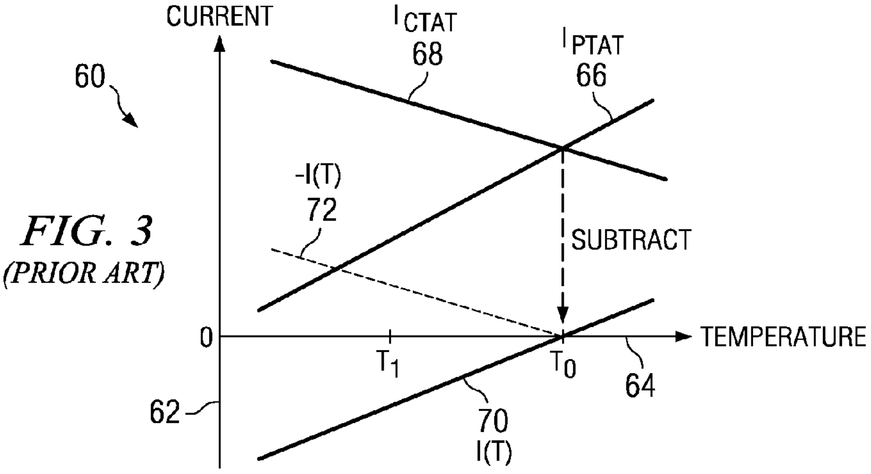
FIG. 3 (PRIOR ART)
FIG. 3 is a graphical depicting the generation of a temperature dependent bias current for FIGS. 1 and/or 2.

Referring to FIG. 1 of the drawings a conventional circuit 10 is shown. Circuit 10 includes an NMOS transistors M1 and M2, PMOS transistors M3 and M4, switches S1 and S2, and current sources 12, 20, and 22. Transistors M1 and M2 are each coupled between the operational amplifier (not shown in FIG. 1) and a current source 12 (which provides a current $I_{b2}$). Transistor M3 is coupled between a voltage source $V_S$ and a line 16, and transistor M4 is coupled between voltage source $V_S$ and a line 18. A gating signal $V_{g1}$ gates transistors M1 and M3, while gating voltage $V_{g2}$ gates transistors M2 and M4. Switch S1 selectively couples one of lines 16 and 18 with current source 20 to impose a zero current bias at a predetermined temperature (0 TC). Switch S2 selectively couples one of lines 16 and 18 with current source 22, where current source 22 is employed to inject a bias current I(T) into one of a sensitive drain in circuit 10 to reduce temperature drift in circuit 10. Additionally, current source 22 is generally comprised of PTAT or Proportional To Absolute Temperature current source 30 (which provides current $I_{PTAT}$) and CTAT or Complementary To Absolute Temperature current source 32 (which provides a current $I_{CTAT}$). Preferably, currents $I_{PTAT}$ and $I_{CTAT}$ are subtracted from one another to present a resulting bias current I(T), which is shown in FIG. 3.

Figure 2:
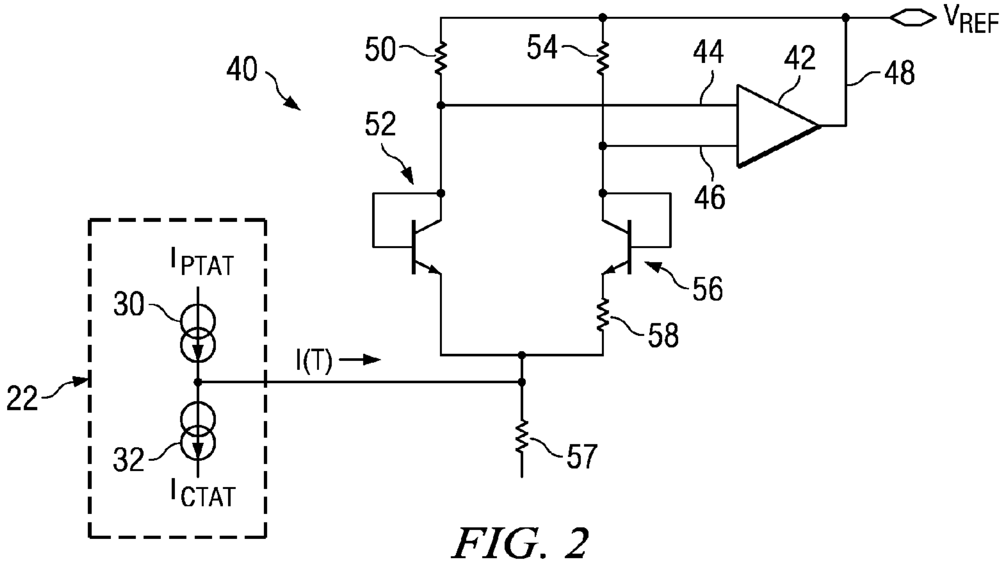
FIG. 2 (PRIOR ART)

Turning to FIG. 2, a conventional bandgap reference circuit 40 is shown. Circuit 40 includes an amplifier 42, resistors 50, 54, 57, and 58, and transistors 52 and 56. Amplifier has input terminals 44 and 46 an output terminal 48. Terminal 44 is coupled to resistor 50 (which receives reference voltage $V_{REF}$) and to a diode-connected transistor 52 (which is coupled to resistor 57). Terminal 46 is coupled to resistor 54 (which receives reference voltage $V_{REF}$) and to diode-connected transistor 56 (which is coupled to resistors 57 and 58). A bias current I(T) is injected into bandgap reference circuit 40 by PTAT current source 30 and CTAT current source 32, where currents $I_{PTAT}$ and $I_{CTAT}$ are subtracted from one another to present a resulting bias current I(T) that is shown in FIG. 3.

Figure 4:
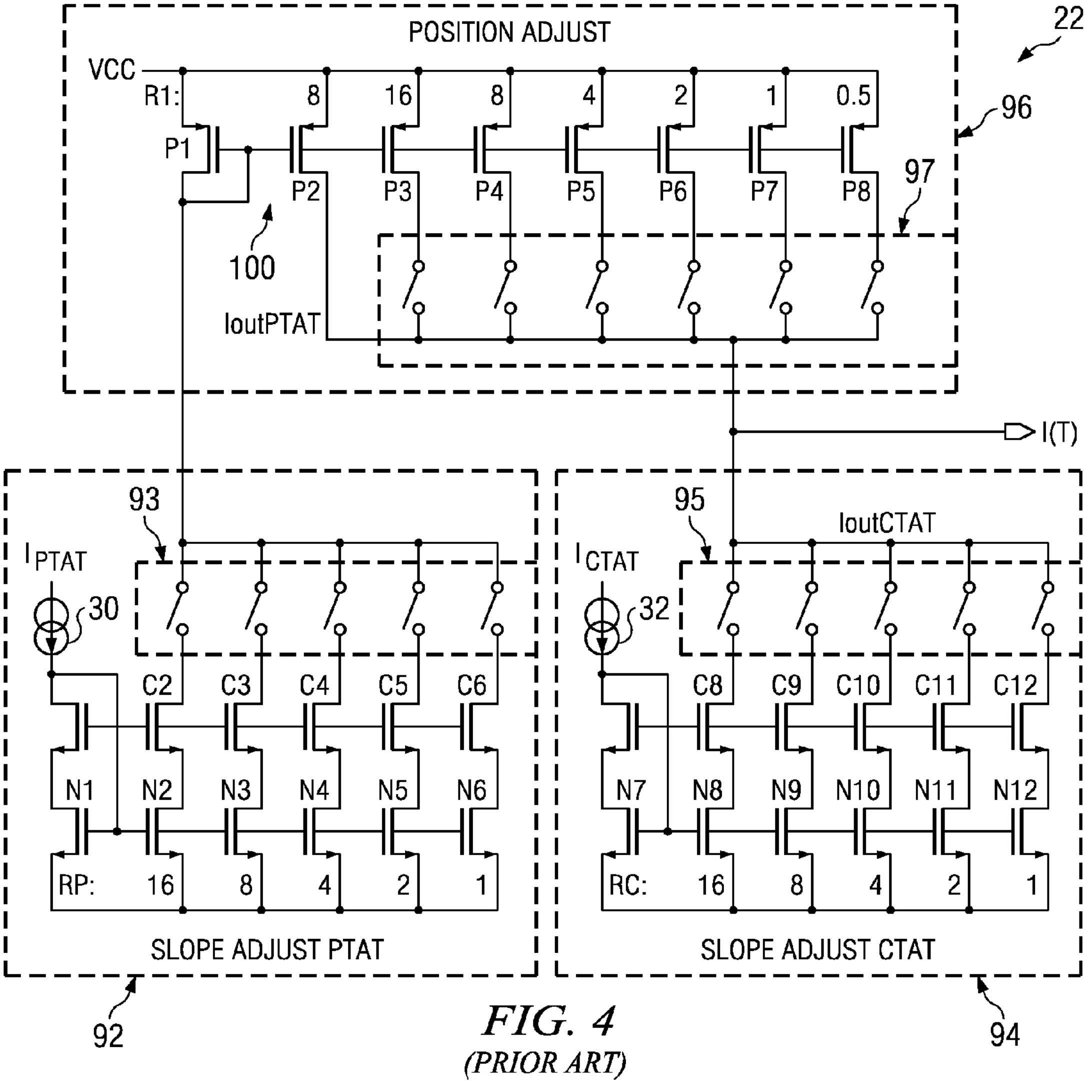
FIG. 4 (PRIOR ART)
FIG. 4 is a diagram illustrating an example of a conventional temperature dependent bias current generator.

Turning to FIG. 4, an example of current source 22 can be seen in greater detail. Current source 22 includes a PTAT slope adjusting unit 92, a CTAT slope adjusting unit 94, and a position adjusting unit 96. PTAT slope adjusting unit 92 generally comprises a digital-to-analog converter or DAC having NMOS transistors N1 through N6 arranged to establish a series of switched current mirrors that cooperate to generate a binary weighted fraction of bias current $I_{PTAT}$ with transistors N2 through N6 operating as current sources related with respective bit positions of a digital representation of current $I_{PTAT}$ ($2^4$ through $2^0$, respectively) Transistors N2 through N6 are selectively engaged using switch network 93, and transistors C2 through C6 are coupled to transistors N2 through N6. CTAT slope adjusting unit 94 generally comprises a DAC having NMOS transistors N7 through N12 arranged to establish a series of switched current mirrors that cooperate to generate a binary weighted fraction of bias current $I_{CTAT}$ with transistors N8 through N12 operating as current sources related with respective bit positions of a digital representation of current $I_{CTAT}$ ($2^4$ through $2^0$, respectively) Transistors N7 through N12 are selectively engaged using switch network 95, and transistors C2 through C6 are coupled to transistors N2 through N6. Additionally, current mirroring for units 92 and 94 may be established in ratios RP and RC established by relative aspect (width/length) ratios among transistors N2 through N6 and N7 through N12, respectively, and adding transistors C2 through C6 and transistors C8 through C12 are optional design features that is a common design practice. Moreover, in operation, the same respective switch control signals are applied to switch networks 93 and 95. That is, the same respective switch control signal is applied to activate or deactivate switches having the same respective position in switch networks 93 and 95 together.

Position adjusting unit 96 also generally comprises a DAC. DAC includes PMOS transistors P1 through P8 and switch network 97. Transistors P1 and P2 generally comprise current mirror 100. Current mirror 100 performs the subtraction the PTAT current $I_{PTAT}$ and CTAT current $I_{CTAT}$. Position adjusting unit 96 senses the weighted algebraic sum of signals selected by closing switches from switch networks 93 and 95. Transistors P3 through P8 establish a series of switched current mirrors that cooperate to generate a binary weighted fraction of subtraction of the PTAT current $I_{PTAT}$ and the CTAT current $I_{CTAT}$. Transistors P3 through P8 are selectively engaged using switch network 97.

Ignoring transistors P3 through P8 for the moment and assuming that transistors P1 and P2 have the same aspect ration, the output current I(T) would be:

$$I(T)=I_{PTAT}(T)\cdot(2\cdot S_2+2^{-1}\cdot S_3+2^{-2}\cdot S_4+2^{-3}\cdot S_5+2^{-4}\cdot S_6)-I_{CTAT}(T)\cdot(2^0\cdot S_8+2^{-1}\cdot S_9+2^{-2}\cdot S_{10}+2^{-3}\cdot S_{11}+2^{-4}\cdot S_{12}), \quad (1)$$

where $S_2=S_8$; $S_3=S_9$; $S_4=S_{10}$; $S_5=S_{11}$; $S_6=S_{12}$. The coefficients $S_2$ through $S_{12}$ are Boolean values ("0" or "1") depending on the switch state of each of respective switches of switch networks 93 and 95. If the value of a coefficient $S_X$ in Equation [1] is "1", then switch $S_X$ is closed (i.e., conducting) and the corresponding current segment contributes both a PTAT and a CTAT current to current I(T) (because $S_2=S_8$; $S_3=S_9$; $S_4=S_{10}$; $S_5=S_{11}$; $S_6=S_{12}$). If the value of a coefficient $S_X$ in Equation [1] is "0", then switch $S_X$ is open (i.e., nonconducting) and the corresponding current segment contributes no current to current I(T). A desired design goal is to force current I(T) to a zero value at a predetermined temperature $T_0$. In Equation [1], this condition is true if the condition $I_{PTAT}(T_0)=I_{CTAT}(T_0)$ holds, as occurs for example at temperature $T_0$ in FIG. 3. The desired result may be achieved by individually trimming current source 30 and current source 32 in a package final test at temperature $T_0$.

In a typical implementation, current source 30 may adjusted (e.g., by trimming) in such a way that $I(T_0)=0$. Temperature dependent current generator 90 permits adjustment of contribution by PTAT current $I_{PTAT}$ to current I(T) using position adjust unit 96. The overall output current I(T) appearing is:

$$I(T)=I_{PTAT}(T)\cdot x\_pos\cdot(2^0\cdot S_2+2^{-1}\cdot S_3+2^{-2}\cdot S_4+2^{-3}\cdot S_5+2^{-4}\cdot S_6)-I_{CTAT}(T)\cdot(2^0\cdot S_8+2^{-1}\cdot S_9+2^{-2}\cdot S_{10}+2^{-3}+S_{11}+2^{-4}\cdot S_{12}) \quad (2)$$

where $S_2=S_8$; $S_3=S_9$; $S_4=S_{10}$; $S_5=S_{11}$; $S_6=S_{12}$; and $x\_pos=(2^{-2}+2^{-1}\cdot S_{14}+2^{-2}\cdot S_{15}+2^{-3}\cdot S_{16}+2^{-4}\cdot S_{17}+2^{-6}\cdot S_{19})$. Equation [2] illustrates that $I(T_0)=0$ can be achieved even if $I_{PTAT}(T_0)\neq I_{CTAT}(T_0)$ by properly selecting coefficients $S_{14}$ through $S_{19}$. This selection of coefficients $S_{14}$ through $S_{19}$ may be effected during a "test at first temperature $T_0$" procedure. After the first test, a second test may be conducted at a significantly different temperature $T_1$ (e.g. nominal or expected operating temperature of the device being compensated. Given test results at two temperatures, an actual temperature drift may be estimated. By way of example and not by way of limitation, in a bandgap device temperature drift may be determined by tracking a reference output voltage.

Temperature drift may be compensated by choosing a binary weighted I(T) sum at the output of temperature dependent current generator 90 that is appropriate to shift the reference output voltage to a target value and injecting this I(T) into the core circuit of the device being compensated. This may be effected using temperature dependent generating circuit 90 by a unique value for the five data input bits at switched in switch networks 93 and 95. In terms of Equation [2], coefficients $S_2$ through $S_6$ and $S_8$ through $S_{12}$ are chosen to adjust $I(T_1)$ to the desired value. The second test described above may be independent from the first test, so there is no requirement for tracking of die identification or tracking previous test data. Test implementation is therefore relatively cheap and easy. In single ended architectures (e.g., bandgap devices), bias current I(T) is provided also with the opposite temperature coefficient. For differential architectures, such as operational amplifiers, one temperature coefficient (e.g. positive) for bias current I(T) is likely sufficient because the compensating bias current I(T) may be injected on either side of the differential path to correct both positive and negative residual temperature coefficients.

Temperature dependent current generator 90, though, has shortcomings. PTAT and CTAT current sources 30 and 32 and transistors N1 through N12 are subject to mismatch variations during manufacture. This mismatch likelihood is not included in Equation [2]. A result of such mismatches is a reduction in absolute accuracy of bias current I(T). The variations can differ among any of transistors N2 through N6 and N8 through N12, so that accuracy of the binary digital representation of bias current I(T) presented is code dependent (i.e., depends on values of coefficients $S_2$ through $S_6$ and $S_8$ through $S_{12}$). By way of example and not by way of limitation, transistor N2 may have a $V_t$ (threshold voltage) mismatch with respect to $V_t$ of transistor N1. Such a mismatch can result in a drain current $I_D$ having a mismatch current $Ierr_2$ between transistors N1 and N2. This mismatch between transistors N1 and N2 may be expressed as:

$$I_D(N2)=I_D(N1)\cdot(1+Ierr_2) \quad (3)$$

Mismatch current $Ierr_2$ can be positive or negative and strongly depends on technology and parameterization of transistors N1 and N2. By way of further example and not by way of limitation, a similar condition may exist with respect to transistors N7 and N8, which is as follows $$I_D(N8)=I_D(N7)\cdot(1+Ierr_8) \quad (4)$$

By way of still further example and not by way of limitation, transistor N3 can have a mismatch voltage $V_t$ with respect to transistor N1 which can be just opposite to the mismatch with respect to transistors N1 and N2. This may occur because statistical mismatch among transistors is uncorrelated as follows:

$$I_D(N3)=I_D(N1)\cdot(1+Ierr_3) \quad (5)$$

Mismatch current $Ierr_3$ can be positive or negative, and in a worst case $Ierr_3=-Ierr_2$. One skilled in the art of transistor circuit design may recognize that similar relations may hold for other transistors N4, N5, N6, and N9 through N12 with all errors uncorrelated. The corrected Equation [2] for I(T) would be:

$$I(T)=I_{PTAT}(T)\cdot x\_pos\cdot(2^0\cdot S_2\cdot(1+Ierr2)+2^{-1}\cdot S_3\cdot(1+Ierr3)+2^{-2}\cdot S_4\cdot(1+Ierr4)+2^{-3}\cdot S_5\cdot(1+Ierr5)+2^{-4}\cdot S_6\cdot(1+Ierr6))-I_{CTAT}(T)\cdot(2^0\cdot S_8\cdot(1+Ierr8)+2^{-1}\cdot S_9\cdot(1+Ierr9)+2^{-2}\cdot S_{10}\cdot(1+Ierr10)+2^{-3}\cdot S_{11}\cdot(1+Ierr11)+2^{-4}\cdot S_{12}\cdot(1+Ierr12)) \quad (6)$$

Because all mismatches currents $Ierr_x$ are uncorrelated, all of the mismatch coefficients may have different magnitudes and cannot be corrected simultaneously by one set of coefficients $S_{14}$ through $S_{19}$ in x_pos. That means the final value of bias current at temperature $T_0$, $I(T_0)$, is code-dependent (i.e. depends on the values of coefficients $S_2$ through $S_6/S_8$ through $S_{12}$).

Figure 5:
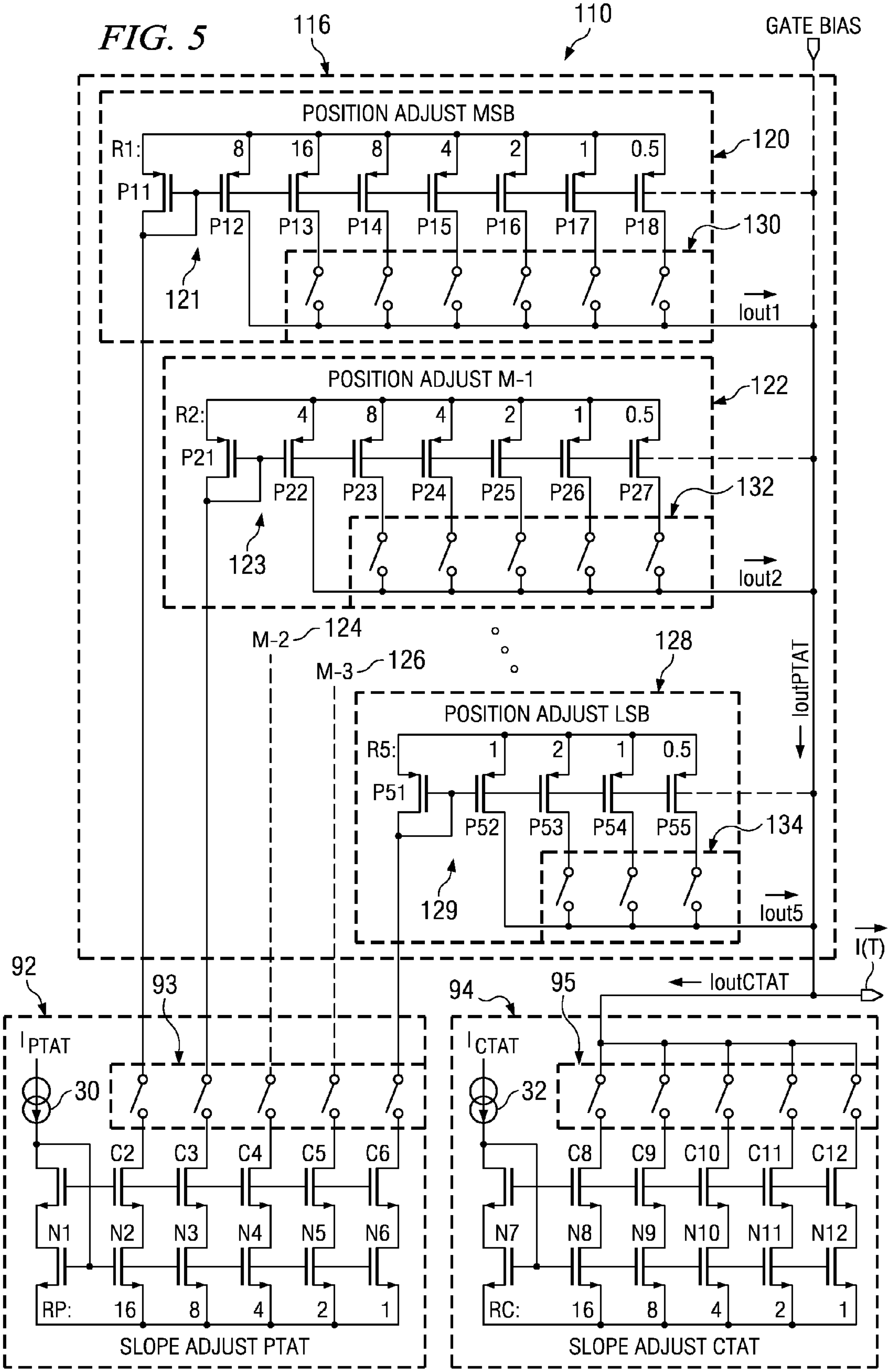
FIG. 5-7 are a diagrams of examples of circuits in accordance with a preferred embodiment of the present invention.

Turning now to FIG. 5, a current generator 110 in accordance with a preferred embodiment of the present invention can be seen. Current generator 110 generally a PTAT slope adjusting unit 92, a CTAT slope adjusting unit 94, and a position adjusting unit 116. As can be seen, unit 92 and 94 of FIG. 5 have the same general structure as the units 92 and 94 of FIG. 4. Position adjusting unit 116, though, is different from unit 96. Unit 116 generally comprises position adjusting arrays 120, 122, 124, 126, and 128. Each of position adjusting arrays 120, 122, 124, 126, and 128 adjusts a respective individual bit output of PTAT slope adjusting unit 92. Each of the position adjusting arrays 120, 122, 124, 126, and 128 corresponds to a switch in switch network 93. However, details are illustrated only for position adjusting arrays 120, 122, and 128 for the sake of simplicity Position adjusting array 120 generally corresponds to the first switch of switch network 93. Array 120 generally comprises a DAC having PMOS transistors P11 through P18 and switch network 130. Transistors P11 and P12 establish a current mirror 121. Current mirror 121 performs current mirroring of output from transistor N2 through the first switch of switch network 93. Position adjusting array 120 presents a representation of current contribution from transistor N2 in a contributing current signal $I_{OUT1}$, and transistors P13 through P18 present current contributions representing the $2^4$ through $2^{-1}$ bit positions, respectively, of a digital representation of current contribution from transistor N2.

Position adjusting array 122 generally corresponds to the second switch of switch network 93. Array 122 generally comprises a DAC having PMOS transistors P21 through P27 and switch network 132. Transistors P21 and P22 establish a current mirror 123. Current mirror 123 performs current mirroring of output from transistor N3 through the second switch of switch network 93. Position adjusting array 122 presents a representation of current contribution from transistor N3 in a contributing current signal $I_{OUT2}$, and transistors P23 through P27 present a current contributions representing the $2^3$ through $2^{-1}$ bit positions, respectively, of a digital representation of current contribution from transistor N3.

Position adjusting array 124 presents a representation of current contribution from transistor N4 in a contributing current signal. Position adjusting array 126 presents a representation of current contribution from transistor N5 in a contributing current signal. Position adjusting arrays 124 and 126 are preferably configured similar to position arrays 120 and 122 providing an array of transistors, each of which may be employed for contributing a current contribution relating to a respective bit position of a digital representation from PTAT slope adjusting unit 93.

Position adjusting array 128 generally corresponds to the last switch of switch network 93, which is the shown as the fifth switch in the example of FIG. 5; however, it should be noted that more or less than five can be employed. Array 128 generally comprises a DAC having PMOS transistors P51, through P55. Transistors P51 and P52 establish a current mirror 129. Current mirror 129 performs current mirroring of output from transistor N6 through the last switch of switch network 93. Position adjusting array 128 presents a representation of current contribution from transistor N6 in a contributing current signal $I_{OUT5}$, and transistor P53 through P55 presents current contribution representing the $2^1$ through $2^{-1}$ bit position of a digital representation of current contribution from transistor N6.

Provision of a plurality of position adjusting arrays 120 through 128 coupled to switch network 93 permits separate balancing of the current contribution of each individual PTAT-CTAT transistor pair N2-N8, N3-N9, N4-N10, N5-N11, and N6-N12. Resolution of the various position adjust arrays 120 through 128 can be reduced as the current of a respective transistor pair Nx-Ny decreases with larger x-y (e.g., current in transistor pair N3-N9 is smaller than current in transistor pair N2-N8). This is indicated by labeling position adjust array 120 as MSB or Most Significant Bit, labeling position adjust array 122 as MSB−1 or Most Significant Bit minus 1, labeling position adjust array 124 as MSB−1 or Most Significant Bit minus 2, labeling position adjust array 126 as MSB−3 or Most Significant Bit minus 3, and labeling position adjust array 128 as LSB or Least Significant Bit. Thus, the corrected Equation [2] for I(T) as applied to temperature dependent current generator 110 is as follows:

$$I(T)=I_{PTAT}(T)\cdot(2^0\cdot S_2\cdot x\_pos_2\cdot(1+Ierr2)+2^{-1}\cdot S_3\cdot x\_pos_3\cdot(1+Ierr3)+2^{-2}\cdot S_4\cdot x\_pos_4\cdot(1+Ierr4)+2^{-3}\cdot S_5\cdot x\_pos_5\cdot(1+Ierr5)+2^{-4}\cdot S_6 x\_pos_6\cdot(1+Ierr6))-I_{CTAT}(T)\cdot(2^0\cdot S_8\cdot(1+Ierr8)+2^{-1}\cdot S_9\cdot(1+Ierr9)+2^{-2}\cdot S_{10}\cdot(1+Ierr10)+2^{-3}\cdot S_{11}\cdot(1+Ierr11)+2^{-4}\cdot S_{12}\cdot(1+Ierr12)) \quad (7)$$

where $S_2=S_8$; $S_3=S_9$; $S_4=S_{10}$; $S_5=S_{11}$; $S_6=S_{12}$; and $x\_pos_z=(2^{-2}+2^{-1}\cdot SP_{z1}+2^{-2}\cdot SP_{z2}+2^{-3}\cdot SP_{z3}+2^{-4}\cdot SP_{z4}+2^{-5}\cdot SP_{z5}+2^{-6}\cdot SP_{z6})$. $SP_{zn}$ also indicates a Boolean coefficient for a switch coupled with a PMOS transistor PZN, such as a coefficient for switch S13 coupled with PMOS transistor P13 in position adjust array 122. From Equation [7] one may observe that each individual mismatch current Ierrn can be compensated by an individual trimming network $x\_pos_z$. For determination of appropriate coefficients for each respective trimming network $x\_pos_z$ one may set all other switches $S_j$, with j≠z, to a nonconducting state and sweep through all coefficient combinations $SP_{iy}$ until the output value approaches desired value (e.g., a desired bandgap output). Additionally, a gate bias GATE BIAS may optionally be applied to the gates of transistors of unit 116.

Figure 6:
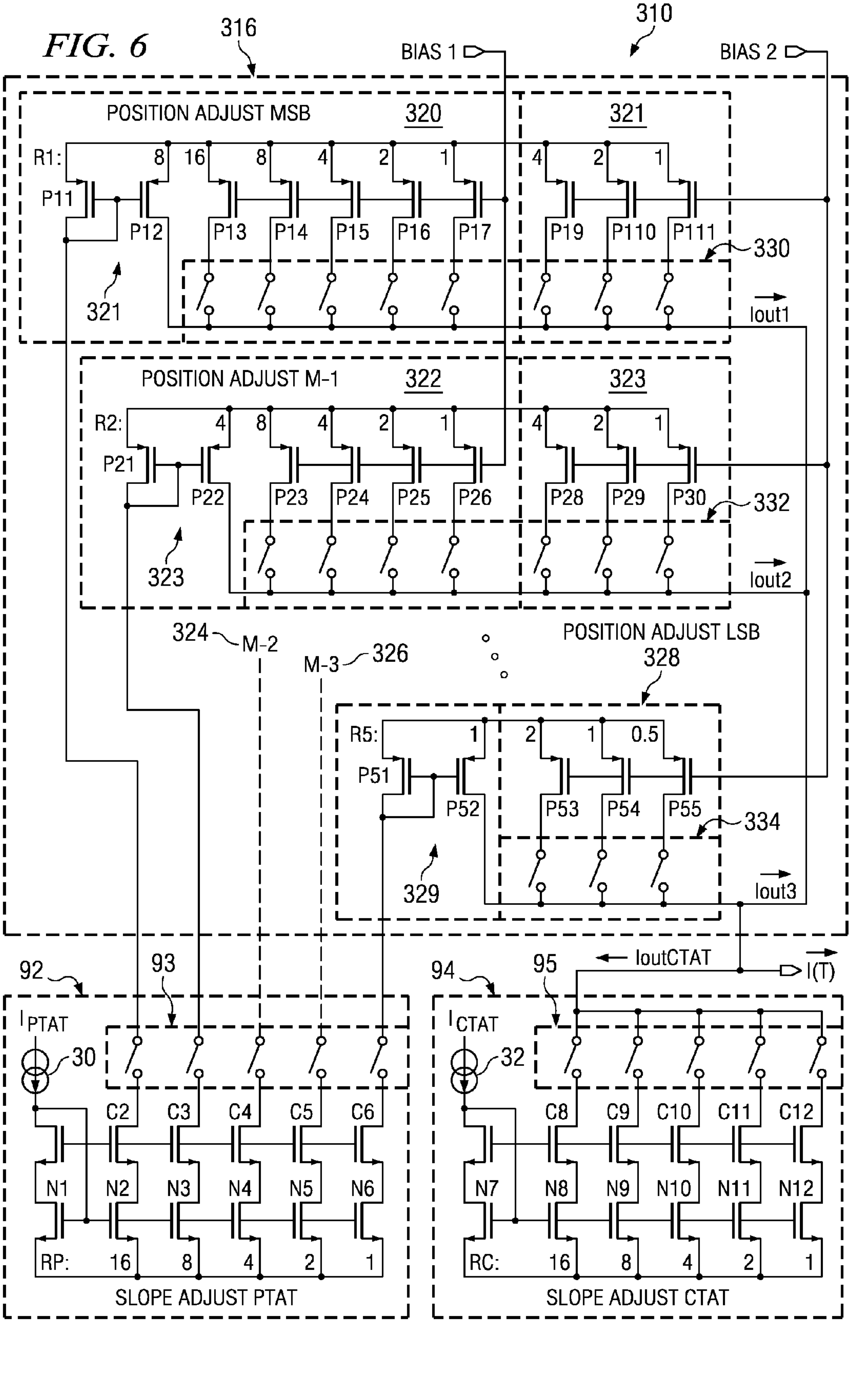

Turning to FIG. 6, current generator 310 can be seen in greater detail. Current generator has a similar configuration to current generator 110, but some there are some differences between unit 316 and 116. Position adjusting unit 316 generally comprises adjusting arrays 320, 321, 322, 323, 324, 326, and 328. Gate bias voltages BIAS1 and BIAS2 are generally provided from separate or external voltage generators. Bias voltage BIAS1 biases transistors P13 through P17 and P23 through P26, and bias voltage BIAS2 biases transistors P18 through P110, P27, through P29, and P53 through P55. Multiple externally generated gate voltages may be used to provide cascaded position adjusting DAC arrays with overlapping dynamic ranges. By way of example and not by way of limitation, in FIG. 6, smaller currents from position adjusting arrays based on voltage BIAS2 are used to interpolate between current values generated by the position adjusting arrays based on voltage BIAS1.

Using different gate bias voltages BIAS1 and BIAS2 with transistors addressing overlapping bit contributions to output currents permits interpolation of contributing currents I(T) with overlapping dynamic range. As shown, transistors P18 and P27 of arrays 120 and 122 are replaced with arrays 312 and 323 so that transistors P19, P110, and P111 in position adjustment array 321 overlap current contributions by transistors P15, P16, and P17 in position adjustment array 320 and transistors P28, P29, and P30 in position adjustment array 323 overlap current contributions by transistors P24, P25, and P26 in position adjustment array 322. Switch arrays 130 and 132 are also replaced by switch netword 330 and 332, respectively. By providing different gate bias voltages BIAS1 and BIAS2 to position adjustment arrays 320, 321, 322, and 323 interpolation may be effected regarding current contributions representing the $2^2$ through $2^0$ bit position of a digital representation of current contribution from transistors N2 and N3. Moreover, details of construction relation to position adjustment arrays 324 and 326 are not illustrated in FIG. 6. However, arrays 324 and 326, preferably, have similar constructions to arrays 320/321 and 322/323.

Figure 7:
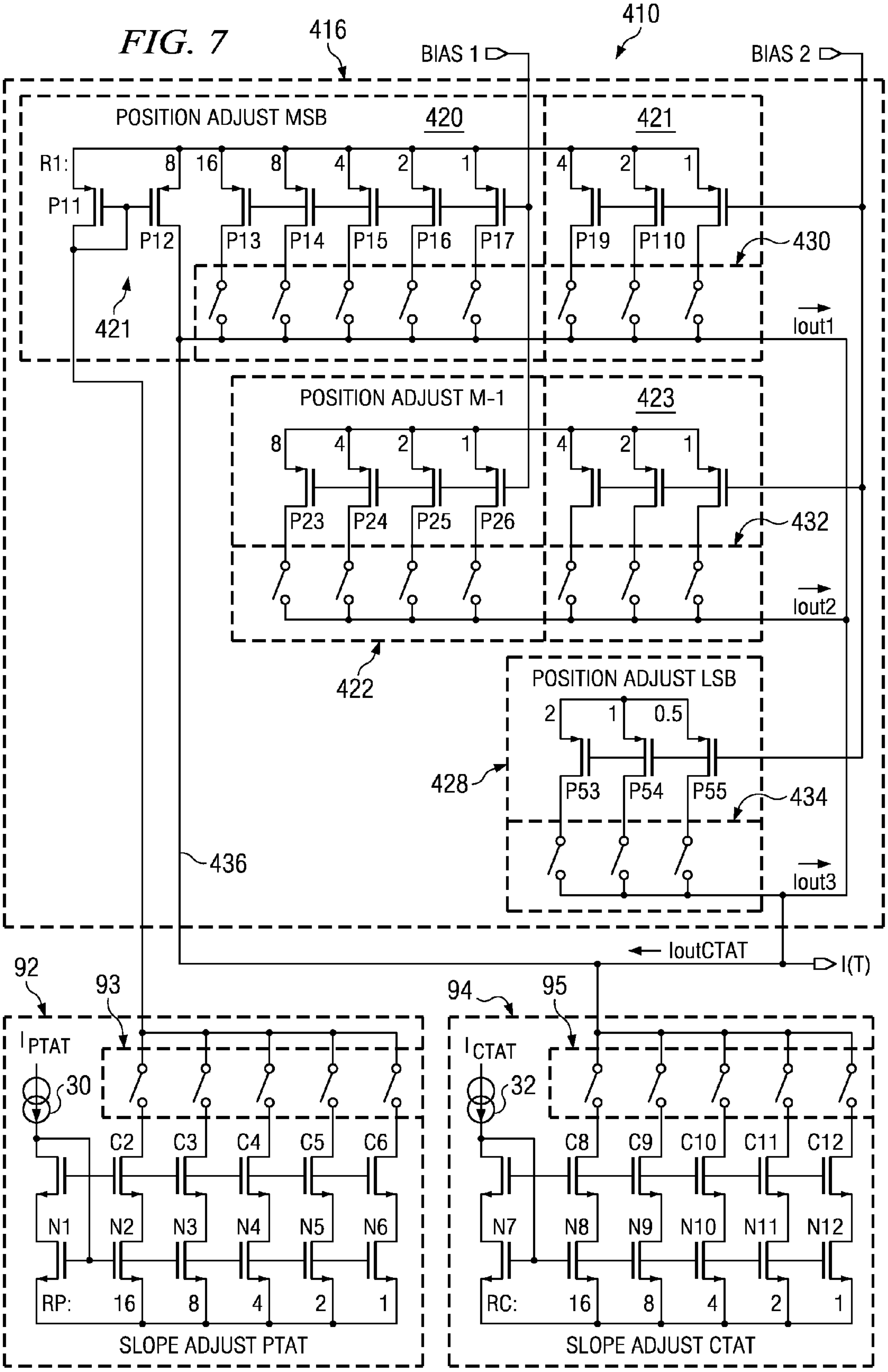
Figure 8:
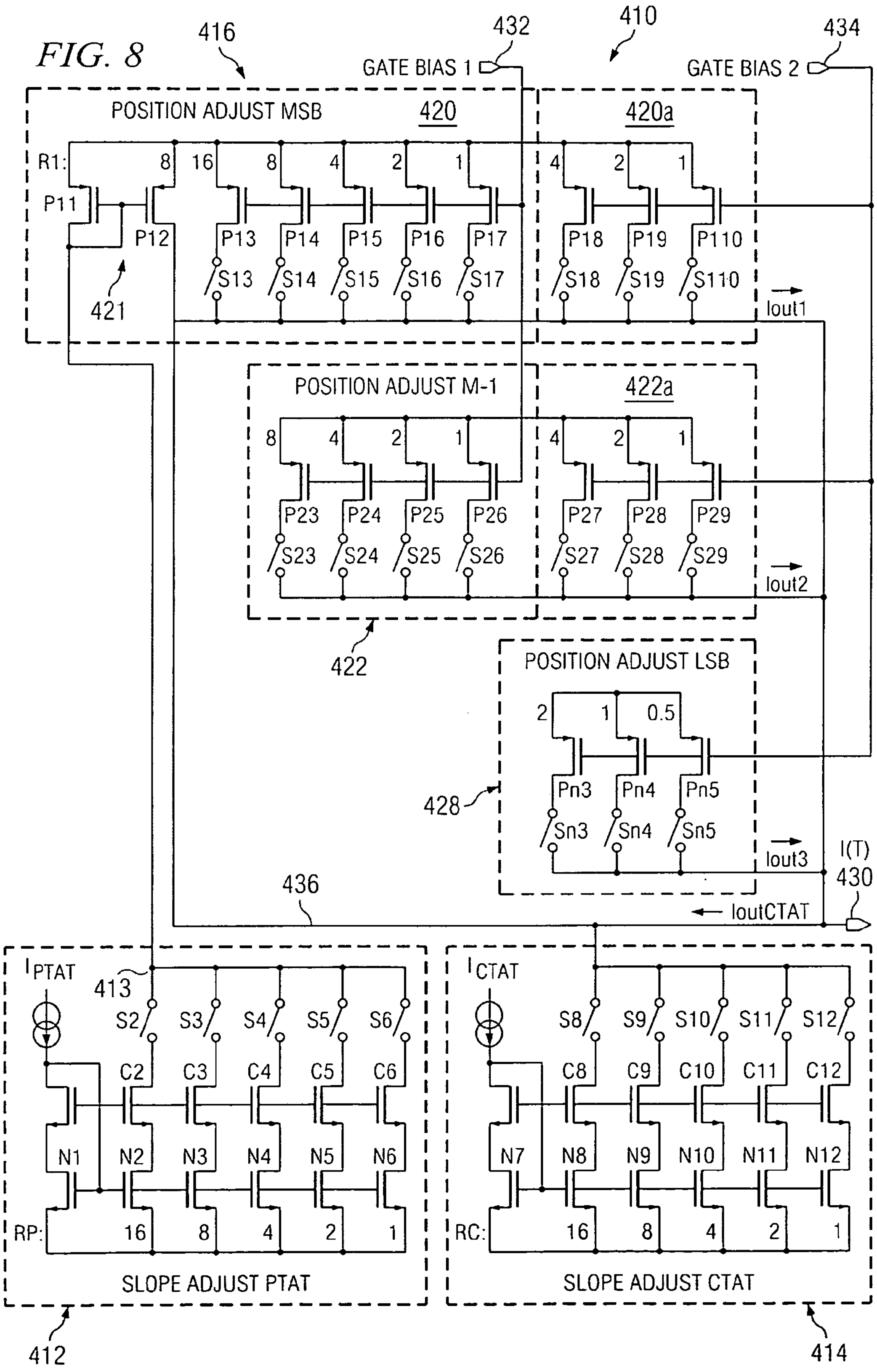
Figure 9:
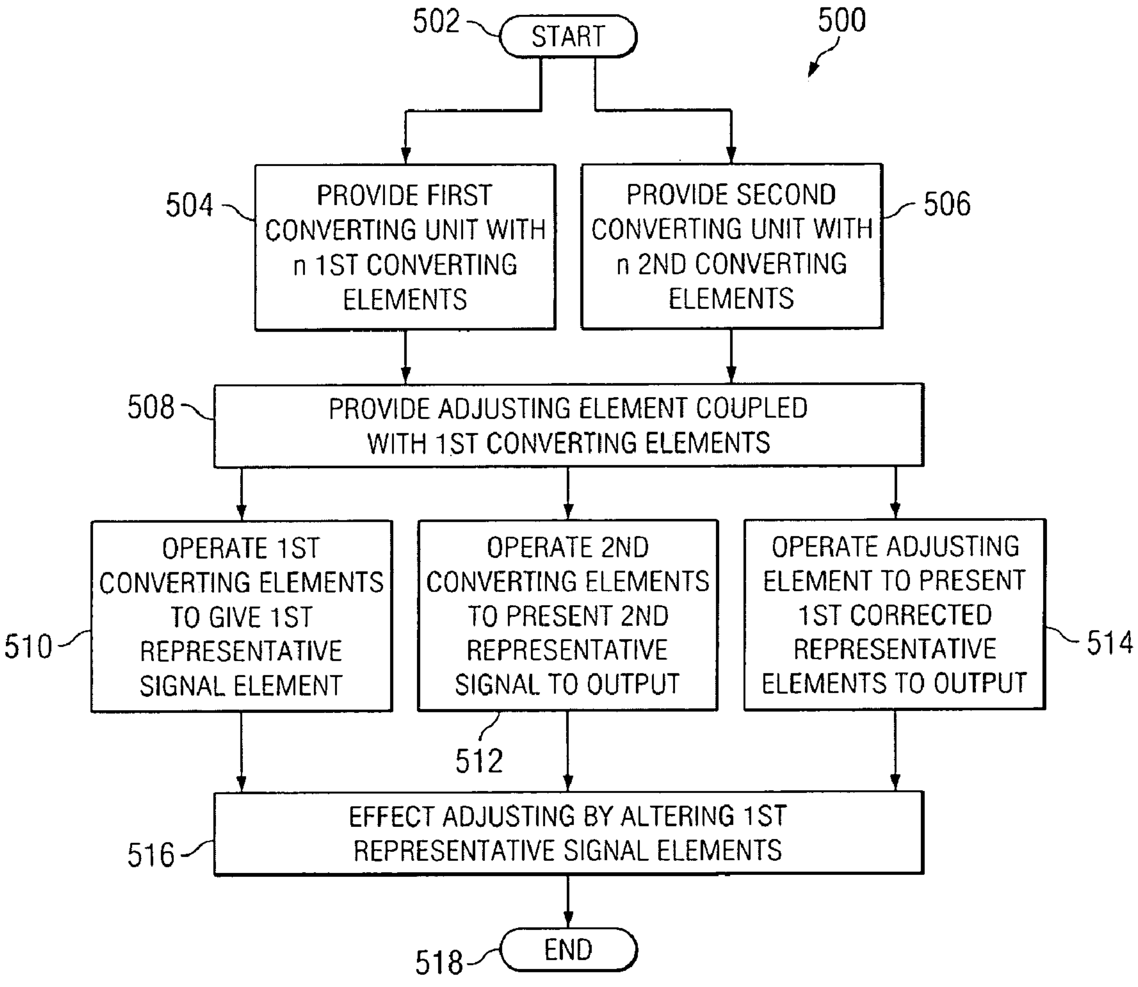

Turning to FIG. 7, current generator 410 can be seen. Current generator 410 is similar to current generator 310; however, there are some differences between unit 316 and 416. While the construction of switching networks 430, 432, and 434 (and corresponding transistors) is largely the same as switching networks 330, 332, and 334 (and corresponding transistors), respectively. Each of arrays 422 and 428 lacks a current mirror. Instead current mirror (comprised of transistors P11 and P12) is coupled to each switch in switch network 93.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

I claim:

1. An apparatus comprising:

a plurality of position adjustment units wherein each position adjustment unit includes:

a current mirror;

a set of transistors wherein each transistor from the set of transistors is coupled to the current mirror at its control electrode; and a first set of switches wherein each switch from the first set of switches is coupled between at least one of the transistors from the set of transistors and an output node;

a first slope adjustment unit having a first digital-to-analog converter (DAC) with a second set of switches, wherein the first slope adjustment unit includes:

a current source that generates a current that is proportional to absolute temperature;

a first switch that is coupled to at least one of the position adjustment units;

a second switch that is coupled to at least one of the position adjustment units;

a third switch that is coupled to at least one of the position adjustment units;

a fourth switch that is coupled to at least one of the position adjustment units;

a fifth switch that is coupled to at least one of the position adjustment units;

a first NMOS transistor that is diode connected and that is coupled to the current source at its drain;

a second NMOS transistor that is coupled to the gate of the first NMOS transistor at its gate and that is coupled to the first switch at its drain;

a third NMOS transistor that is coupled to the gate of the first NMOS transistor at its gate and that is coupled to the second switch at its drain;

a fourth NMOS transistor that is coupled to the gate of the first NMOS transistor at its gate and that is coupled to the third switch at its drain;

a fifth NMOS transistor that is coupled to the gate of the first NMOS transistor at its gate and that is coupled to the fourth switch at its drain; and a sixth NMOS transistor that is coupled to the gate of the first NMOS transistor at its gate and that is coupled to the fifth switch at its drain; and a second slope adjustment unit having a second DAC with a third set of switches wherein each switch from the third set of switches is coupled to the output node.

2. The apparatus of claim 1, wherein the control electrodes of each transistor from each set of transistors receives a bias voltage.

3. The apparatus of claim 1, wherein the plurality of position adjustment units further comprises a plurality of most significant bit (MSB) position adjustment units and a least significant bit (LSB) position adjustment unit.

4. The apparatus of claim 3, wherein the set of transistors from each MSB position adjustment unit further comprises:

a first subset of transistors, wherein each transistor from the first subset of transistors receives a first bias voltage at its control electrode; and a second subset of transistors, wherein each transistor from the second subset of transistors receives a second bias voltage at its control electrode.

5. A apparatus comprising:

a first slope adjustment unit having a first DAC with a first set of switches;

a plurality of position adjustment units wherein each position adjustment unit includes:

a current mirror that is coupled to at least one of the switches from the first set of switches;

a set of transistors wherein each transistor from the set of transistors is coupled to the current mirror at its control electrode; and a second set of switches wherein each switch from the third set of switches is coupled between at least one of the transistors from the set of transistors and an output node; and a second slope adjustment unit having a second DAC with a third set of switches wherein each switch from the third set of switches is coupled to the output node, wherein the second slope adjustment unit includes:

a current source that generates a current that is complementary to absolute temperature;

a first switch that is coupled to the output node;

a second switch that is coupled to the output node;

a third switch that is coupled to the output node;

a fourth switch that is coupled to the output node;

a fifth switch that is coupled to the output node;

a first NMOS transistor that is diode connected and that is coupled to the current source at its drain;

a second NMOS transistor that is coupled to the gate of the first NMOS transistor at its gate and that is coupled to the first switch at its drain;

a third NMOS transistor that is coupled to the gate of the first NMOS transistor at its gate and that is coupled to the second switch at its drain;

a fourth NMOS transistor that is coupled to the gate of the first NMOS transistor at its gate and that is coupled to the third switch at its drain;

a fifth NMOS transistor that is coupled to the gate of the first NMOS transistor at its gate and that is coupled to the fourth switch at its drain; and a sixth NMOS transistor that is coupled to the gate of the first NMOS transistor at its gate and that is coupled to the fifth switch at its drain.

6. The apparatus of claim 5, wherein the control electrodes of each transistor from each set of transistors receives a bias voltage.

7. The apparatus of claim 5, wherein the plurality of position adjustment units further comprises a plurality of most significant bit (MSB) position adjustment units and a least significant bit (LSB) position adjustment unit.

8. The apparatus of claim 7, wherein the set of transistors from each MSB position adjustment unit further comprises:

a first subset of transistors, wherein each transistor from the first subset of transistors receives a first bias voltage at its control electrode; and a second subset of transistors, wherein each transistor from the second subset of transistors receives a second bias voltage at its control electrode.

9. An apparatus comprising:

a first slope adjustment unit having a first DAC with a first set of switches;

a second slope adjustment unit having a second DAC with a second set of switches, wherein each switch from the second set of switches is coupled to an output node;

a first MSB position adjustment units including:

a current mirror that is coupled to each switch from the first set of switches;

a first set of transistors, wherein each transistor from the first set of transistors receives a first bias voltage at its control electrode a second set of transistors, wherein each transistor from the second set of transistors receives a second bias voltage at its control electrode; and a third set of switches, wherein each switch from the third set of switches is coupled between at least one of the transistors from one of the first and second sets of transistors and the output node;

an intermediate MSB position adjustment units including:

a third set of transistors, wherein each transistor from the third set of transistors receives the first bias voltage at its control electrode;

a fourth set of transistors, wherein each transistor from the fourth set of transistors receives the second bias voltage at its control electrode; and a fourth set of switches, wherein each switch from the fourth set of switches is coupled between at least one of the transistors from one of the third and fourth sets of transistors and the output node; and an LSB position adjustment unit including:

a fifth set of transistors, wherein each transistor from the fifth set of transistors receives the second bias voltage at its control electrode; and a fifth set of switches, wherein each switch from the fourth set of switches is coupled between at least one of the transistors from the fifth sets of transistors and the output node.

10. The apparatus of claim 9, wherein the first slope adjustment unit further comprises:

a current source that generates a current that is proportional to absolute temperature;

a first switch that is coupled to at least one of the position adjustment units;

a second switch that is coupled to at least one of the position adjustment units;

a third switch that is coupled to at least one of the position adjustment units;

a fourth switch that is coupled to at least one of the position adjustment units;

a fifth switch that is coupled to at least one of the position adjustment units;

a first NMOS transistor that is diode connected and that is coupled to the current source at its drain;

a second NMOS transistor that is coupled to the gate of the first NMOS transistor at its gate and that is coupled to the first switch at its drain;

a third NMOS transistor that is coupled to the gate of the first NMOS transistor at its gate and that is coupled to the second switch at its drain;

a fourth NMOS transistor that is coupled to the gate of the first NMOS transistor at its gate and that is coupled to the third switch at its drain;

a fifth NMOS transistor that is coupled to the gate of the first NMOS transistor at its gate and that is coupled to the fourth switch at its drain; and a sixth NMOS transistor that is coupled to the gate of the first NMOS transistor at its gate and that is coupled to the fifth switch at its drain.

11. The apparatus of claim 9, wherein the second slope adjustment unit further comprises:

a current source that generates a current that is complementary to absolute temperature;

a first switch that is coupled to the output node;

a second switch that is coupled to the output node;

a third switch that is coupled to the output node;

a fourth switch that is coupled to the output node;

a fifth switch that is coupled to the output node;

a first NMOS transistor that is diode connected and that is coupled to the current source at its drain;

a second NMOS transistor that is coupled to the gate of the first NMOS transistor at its gate and that is coupled to the first switch at its drain;

a third NMOS transistor that is coupled to the gate of the first NMOS transistor at its gate and that is coupled to the second switch at its drain;

a fourth NMOS transistor that is coupled to the gate of the first NMOS transistor at its gate and that is coupled to the third switch at its drain;

a fifth NMOS transistor that is coupled to the gate of the first NMOS transistor at its gate and that is coupled to the fourth switch at its drain; and a sixth NMOS transistor that is coupled to the gate of the first NMOS transistor at its gate and that is coupled to the fifth switch at its drain.

12. An apparatus comprising:

a first slope adjustment unit having:

a first set of switches;

a first set of NMOS transistors, wherein each NMOS transistor from the first set of NMOS transistors is coupled to at least one of the switches from the first set of switches at its drain;

a first diode-connected NMOS transistor that is coupled to the gate of each NMOS transistor from the first set of NMOS transistors at its gate a first current source that is coupled to first diode-connected NMOS transistor, wherein the first current source generates a current that is proportional to absolute temperature;

a second slope adjustment unit having:

a second set of switches, wherein each switch from the second set is coupled to an output node;

a second set of NMOS transistors, wherein each NMOS transistor from the second set of NMOS transistors is coupled to at least one of the switches from the second set of switches at its drain;

a second diode-connected NMOS transistor that is coupled to the gate of each NMOS transistor from the second set of NMOS transistors at its gate a second current source that is coupled to first diode-connected NMOS transistor, wherein the first current source generates a current that is complementary to absolute temperature;

a plurality of position adjustment units, wherein each position adjustment unit includes:

a diode-connected PMOS transistor that is coupled to at least one of the switches from the first set of switches at its drain;

a first PMOS transistor that is coupled to the output node at its drain and the gate of the diode-connected PMOS transistor at its gate;

a set of PMOS transistor;

a third set of switches, wherein each switch from the third set of switches is coupled between the drain of at least one of the transistors from the set of PMOS transistors and the output node.

13. The apparatus of claim 12, wherein the gates of each transistor from each set of PMOS transistors receives a bias voltage.

14. The apparatus of claim 12, wherein the gates of each transistor from each set of PMOS transistors is coupled to the gate of its corresponding diode-connected PMOS transistor.

15. The apparatus of claim 12, wherein the plurality of position adjustment units further comprises a plurality of most significant bit (MSB) position adjustment units and a least significant bit (LSB) position adjustment unit.

16. The apparatus of claim 15, wherein the set of PMOS transistors from each MSB position adjustment unit further comprises:

a first subset of PMOS transistors, wherein each PMOS transistor from the first subset of PMOS transistors receives a first bias voltage at its gate; and a second subset of PMOS transistors, wherein each PMOS transistor from the second subset of PMOS transistors receives a second bias voltage at its gate.

* * * * *